(12) United States Patent
Hung et al.

(10) Patent No.: US 7,554,477 B2
(45) Date of Patent: Jun. 30, 2009

(54) AMPLIFIER ARRAY CIRCUITS AND FLASH ANALOG TO DIGITAL CONVERTERS

(75) Inventors: Chien-Kai Hung, Taipei (TW); Hsin-Shu Chen, Taipei (TW)

(73) Assignee: National Taiwan University, Taipei (TW)

( * ) Notice: Subject to any disclaimer, the term of this patent is extended or adjusted under 35 U.S.C. 154(b) by 0 days.

(21) Appl. No.: 11/938,325

(22) Filed: Nov. 12, 2007

(65) Prior Publication Data

US 2008/0266162 A1  Oct. 30, 2008

(30) Foreign Application Priority Data

Apr. 30, 2007  (TW) .............................. 96115340 A

(51) Int. Cl.
*H03M 1/36* (2006.01)
(52) U.S. Cl. ........................................ 341/159; 330/99
(58) Field of Classification Search ................. 341/155, 341/159; 330/99
See application file for complete search history.

(56) References Cited

U.S. PATENT DOCUMENTS 6,034,630 A * 3/2000 Komatsu et al. ............ 341/159
6,232,907 B1 * 5/2001 Nagaraj et al. .............. 341/159

OTHER PUBLICATIONS

Chien-Kai Hung et al, *A 6-bit 1.6 GS/s Flash ADC in 0.18-μm CMOS with Reversed-Reference Dummy*, IEEE Asian Solid-State Circuits Conference (A-SSCC), Nov. 13, 2006, Hangzhou, China.

* cited by examiner

*Primary Examiner*—Peguy JeanPierre
(74) *Attorney, Agent, or Firm*—Quintero Law Office

(57) ABSTRACT

An amplifier array circuit is provided. An amplifier array includes a main amplifier array comprising a plurality of first amplifiers and a plurality of reference voltages, wherein the first amplifier is coupled to an input signal and the reference voltage corresponding to the first amplifier. A first reversed reference voltage amplifier array is located on one side of the main amplifier array and has a plurality of second amplifiers coupled to the input signal and the reference voltages, respectively. A second reversed reference voltage amplifier array is located on the other side of the main amplifier array and has a plurality of third amplifiers coupled to the input signal and the reference voltages respectively. The averaging network is coupled to a first output terminal and a second output terminal of the first, second and third amplifiers.

18 Claims, 6 Drawing Sheets

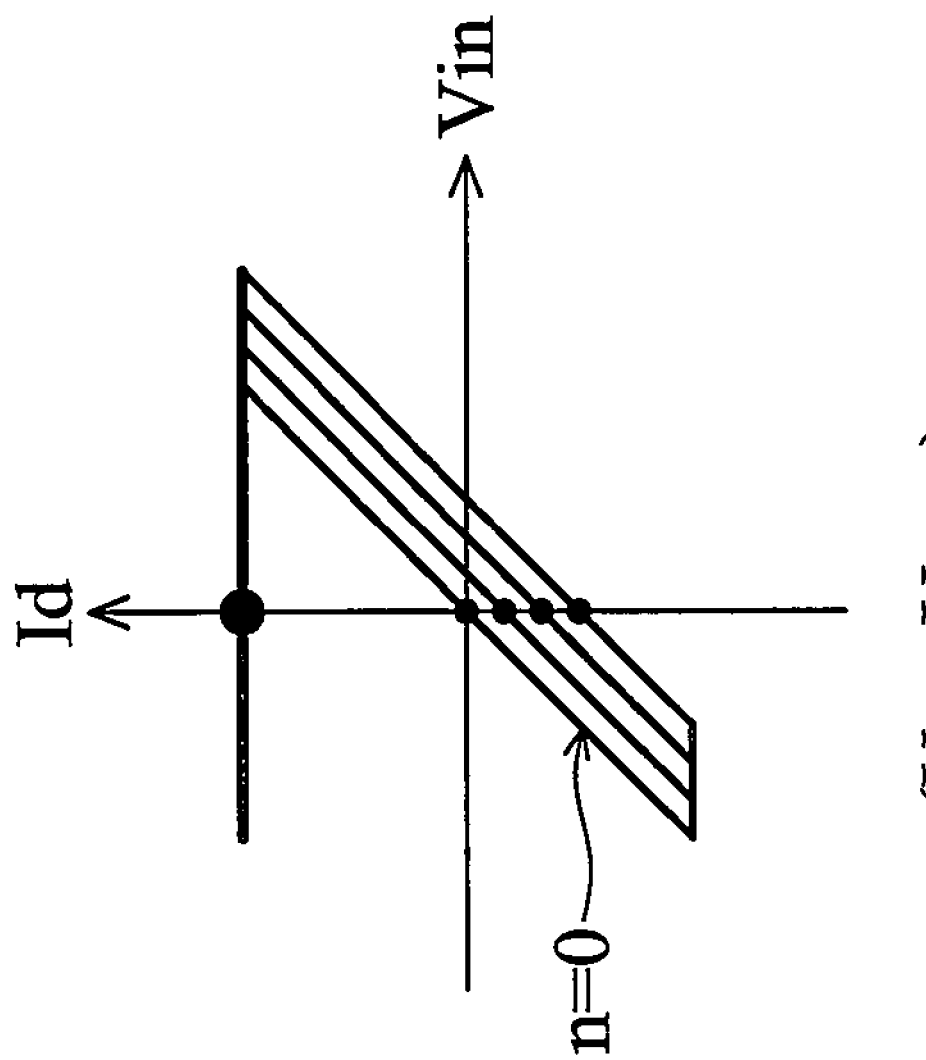

AMPLIFIER ARRAY CIRCUITS AND FLASH ANALOG TO DIGITAL CONVERTERS

BACKGROUND OF THE INVENTION

1. Field of the Invention

The invention relates to flash analog to digital converters (ADCs), and more particularly to a flash ADC with reversed reference voltage dummy amplifiers.

2. Description of the Related Art

High-speed and low-resolution flash ADCs are widely used in current circuit systems, such as disk drive read channel, DVD playback and communication receiver systems. However, in complementary metal-oxide-semiconductor (CMOS) processes, offset voltages occur in flash ADCs due to device mismatch in preamplifiers and comparators, causing signal distortion.

For conventional flash ADCs, an averaging network is implemented to reduce the offset voltages. The averaging network is coupled to the output terminals of adjacent preamplifiers to average a static offset of a preamplifier array and reduce a dynamic offset of a comparator array. However, in a finite preamplifier array, the preamplifiers located on both sides/boundaries of the preamplifier array will not have the same environment as those located in the middle of the preamplifier array. Therefore, zero crossing (ZX) point offsets of the preamplifiers located on both sides of the array will result in integral nonlinearity (INL) curvature and cause systematic error.

Conventionally, a dummy method is implemented to solve the above boundary problems. The dummy method builds an infinitely long averaging network by increasing enormous amounts of, dummy amplifiers at both boundaries of the preamplifier array to rebuild the same environment as the middle of the preamplifier array and form a cross-connecting array. The dummy method requires enormous amounts of dummy amplifiers, dummy comparators and additional reference voltages, wherein the amount of dummy amplifiers and additional reference voltages are the same. However, in full-scale input range, the additional reference voltages corresponding to the dummy amplifiers will decrease least significant bit (LSB) voltage, thus making it difficult to implement the dummy method in a low supply voltage system.

BRIEF SUMMARY OF THE INVENTION

Amplifier array circuits and flash analog to digital converters are provided. An exemplary embodiment of such an amplifier array circuit comprises an amplifier array and an averaging network. The amplifier array comprises a main amplifier array comprising a plurality of first amplifiers and a plurality of reference voltages, wherein the first amplifier is coupled to an input signal and the reference voltage corresponding to the first amplifier, a first reversed reference voltage amplifier array located on one side of the main amplifier array, having a plurality of second amplifiers coupled to the input signal and the reference voltages respectively, and a second reversed reference voltage amplifier array located on the other side of the main amplifier array, having a plurality of third amplifiers coupled to the input signal and the reference voltages respectively. The averaging network is coupled to a first output terminal and a second output terminal of the first, second and third amplifiers.

Furthermore, an exemplary embodiment of a flash analog to digital converter comprises a track and hold amplifier for sampling a first analog signal to generate a second analog signal, a preamplifier array coupled between the track and hold amplifier and a first averaging network, amplifying the second analog signal to generate a plurality of third analog signals, a comparator array having a plurality of comparators, comparing the third analog signal to generate a plurality of first digital signals, and an encoder for receiving the first digital signals to encode as a second digital signal. The preamplifier array comprises a main amplifier array comprising a plurality of first amplifiers and a plurality of reference voltages, wherein the first amplifier is coupled to an input signal and the reference voltage corresponding to the first amplifiers, a first reversed reference voltage amplifier array located on one side of the main amplifier array, having a plurality of second amplifiers coupled to the input signal and the reference voltages respectively, and a second reversed reference voltage amplifier array located on the other side of the main amplifier array, having a plurality of third amplifiers coupled to the input signal and the reference voltages respectively, wherein the first averaging network is coupled to a first output terminal and a second output terminal of the first, second and third amplifiers.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein:

FIGS. 1B and 1C show the current diagram of the amplifier array shown in FIG. 1A;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
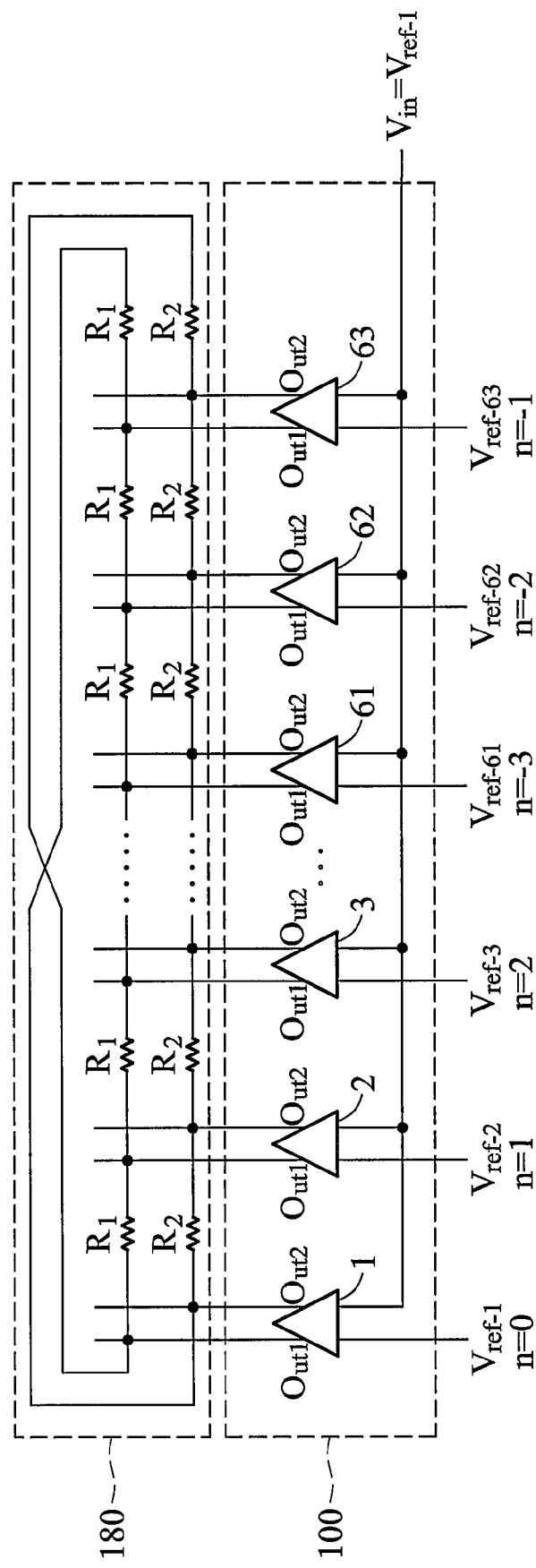
FIG. 1A shows an amplifier array having an averaging network.

FIG. 1A shows an amplifier array 100 having an averaging network 180. For example, the amplifier array 100 is a 6-bit flash ADC which comprises 63 amplifiers coupled to a signal $V_{in}$. The amplifiers 1-63 are also coupled to different reference voltages ($V_{ref-1}$ to $V_{ref-63}$) respectively, wherein the voltage values of reference voltage $V_{ref-1}$ to the reference voltage $V_{ref-63}$ are increased gradually, i.e. $V_{ref-1} < V_{ref-2} < V_{ref-3} < \cdots < V_{ref-61} < V_{ref-62} < V_{ref-63}$. The averaging network 180 is coupled to the output terminals of the amplifier array 100 and comprises a plurality of resistors $R_1$ and $R_2$. Moreover, the averaging network 180 uses a cross-connecting manner to preserve impulse response symmetry, wherein an output terminal $Out_1$ of the amplifier 1 is coupled to an output terminal $Out_2$ of the amplifier 63 through the resistor $R_2$, and an output terminal $Out_2$ of the amplifier 1 is coupled to an output terminal $Out_1$ of the amplifier 63 through the resistor $R_1$.

It is assumed that, in FIG. 1A, the signal $V_{in}$ is equal to the reference voltage $V_{ref-1}$, and various amplifiers near the amplifier 63 (ex. amplifiers 55-63) are operated in the saturation region. It is noted that amplifiers 55 to 63 operated in the saturation region are an example. In actual application, the amount of clipped amplifiers, which operate in the saturation region, will be affected by the signal $V_{in}$ and the reference voltages $V_{ref-1}$-$V_{ref-63}$. A saturation current $I_{sat}$ of the clipped amplifiers will flow into an output impedance of the amplifier 1 through a cross-connecting point due to both sides of the averaging network 180 being cross-connected to form a circular structure. Thus, a ZX point of amplifier 1 is shifted outward and the ZX point offset will cause systematic error.

Figure 1B:
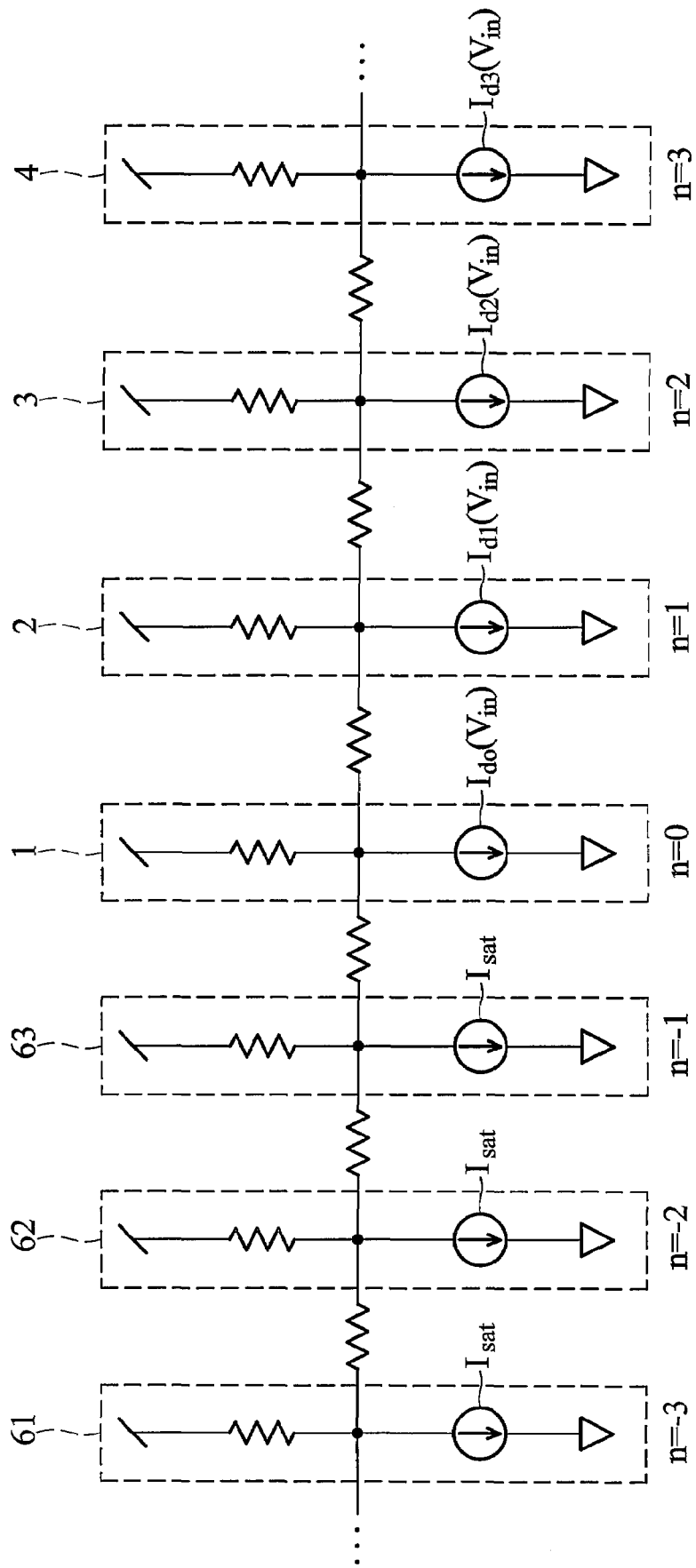

FIGS. 1B and 1C show the current diagram of the amplifier array 100 shown in FIG. 1A. As shown in FIGS. 1B and 1C, a differential pair of the amplifier in the amplifier array 100 can be modeled as a large signal current source. For the amplifier at n=0 (i.e. amplifier 1), the differential output currents $I_{dn}$, from the adjacent amplifiers (n=1, n=2 . . . ) on the right half averaging window, have less impact than the saturation currents, $I_{sat}$, from the clipped amplifiers (n=−1, n=−2 . . . ) on the left half averaging window. Therefore, the total current $I_0$ on the load of the amplifier at n=0 can be calculated as the following formula (1)

$$I_0 = \sum_{n=-1}^{-k} I_{sat} h(n) + I_{d0} h(0) + \sum_{n=1}^{k} I_{dn}(V_{in}) h(n) \quad (1)$$

where k is a length of half averaging window and h(n) is impulse response. If the currents from the both half averaging window to the amplifier at n=0 are equal, the ZX point at n=0 will not be shifted and the current $I_0$ shown in formula (1) is equal to zero. On the contrary, the ZX point at n=0 will have been shifted when the current $I_0$ is not equal to zero.

Figure 2:
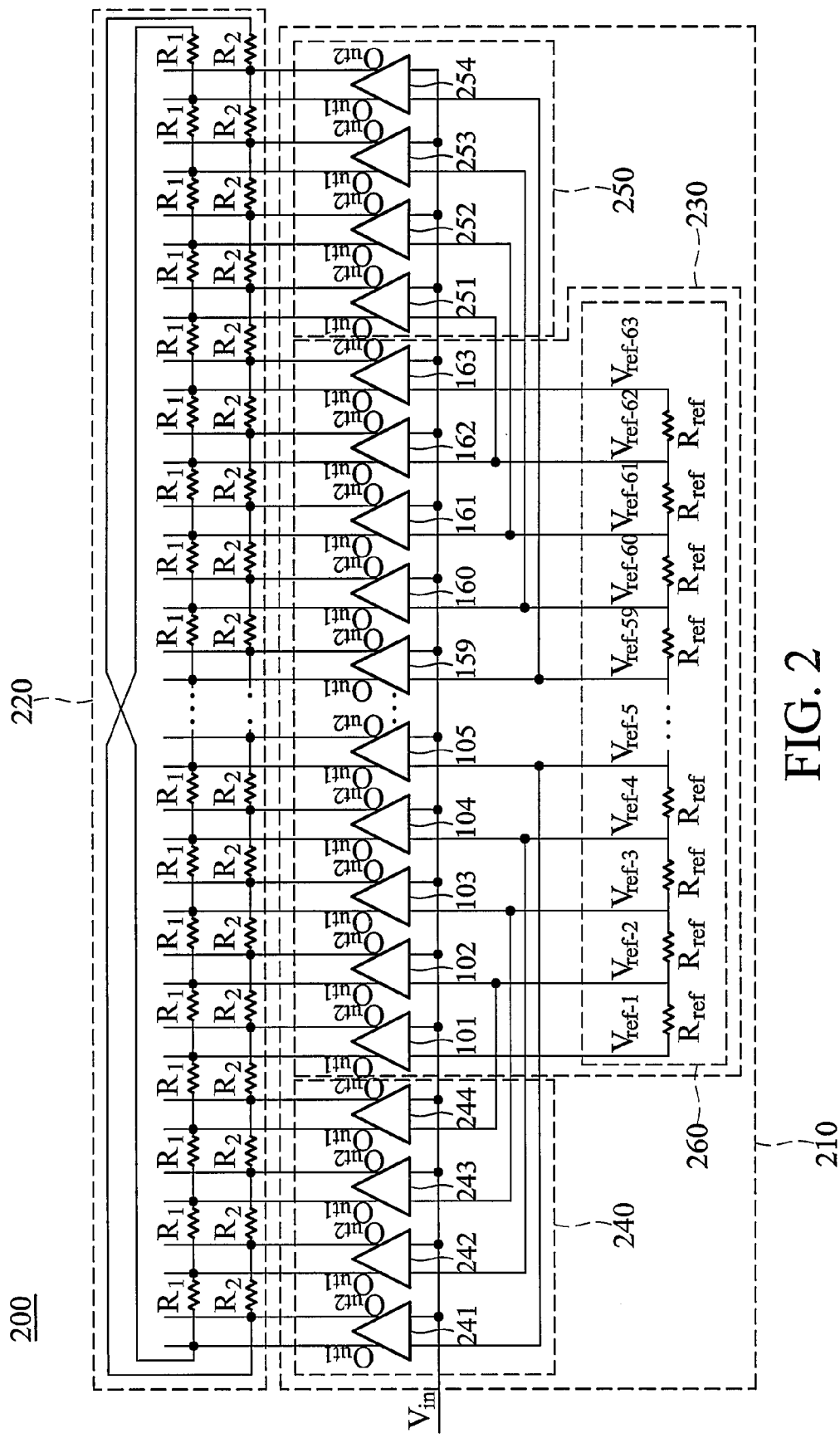
FIG. 2 shows an amplifier array circuit according to an embodiment of the invention.

FIG. 2 shows an amplifier array circuit 200 according to an embodiment of the invention. The amplifier array circuit 200 comprises an amplifier array 210 and an averaging network 220. The amplifier array 210 comprises a main amplifier array 230 and two reversed reference voltage amplifier arrays 240 and 250, wherein the reversed reference voltage amplifier array 240 is located on one side of the main amplifier array 230 and the reversed reference voltage amplifier array 250 is located on the other side. In this embodiment, the amplifier array circuit 200 is a 6-bit flash ADC, and the main amplifier, array 230 comprises 63 amplifiers, i.e. amplifiers 101-163. The reversed reference voltage amplifier array 240 comprises four amplifiers 241-244 and the reversed reference voltage amplifier array 250 comprises four amplifiers 251-254, wherein the amplifiers 241-244, 251-254 and 101-163 have the same circuit structure. A voltage divider 260 comprises a resistor string composed of 62 resistors $R_{ref}$ connected in series for generating reference voltages $V_{ref-1}$-$V_{ref-63}$, wherein the resistors $R_{ref}$ are coupled to the amplifiers 101-163 respectively. The reference voltages $V_{ref-1}$ and $V_{ref-63}$ are the minimum and maximum reference voltages respectively. As shown in FIG. 2, whole amplifiers of the amplifier array 210 are coupled to a signal $V_{in}$. The amplifiers 241-244 are separately coupled to the reference voltages $V_{ref-5}$-$V_{ref-2}$, and the amplifiers 251-254 are separately coupled to the reference voltages $V_{ref-62}$-$V_{ref-59}$.

The averaging network 220 comprises a plurality of resistors $R_1$ and $R_2$. The resistor $R_1$ is coupled between output terminals $Out_1$ of two adjacent amplifiers in the amplifier array 210, and the resistor $R_2$ is coupled between output terminals $Out_2$ of two adjacent amplifiers in the amplifier array 210. Furthermore, both sides of the averaging network 220 are cross-connected, such that the output terminal $Out_1$ of the amplifier 241 is coupled to the output terminal $Out_2$ of the amplifier 254 through the resistor $R_2$, and the output terminal $Out_2$ of the amplifier 241 is coupled to the output terminal $Out_1$ of the amplifier 254 through the resistor $R_1$.

As shown in FIG. 2, the dummy amplifiers (i.e. amplifiers 241-244 and 251-254) are added on both sides of the main amplifier array 230, wherein the dummy amplifiers can generate currents to cancel a large saturation current $I_{sat}$ and the generated currents flow in opposite direction of the saturation current $I_{sat}$. Whole amplifiers of the reversed reference voltage amplifier arrays 240 and 250 are coupled to the reference voltages provided by the main amplifier array 230, and can also be named, a reversed reference voltage dummy amplifier. The LSB voltage of the amplifier array circuit 200 will not be decreased when operating with low supply voltage due to elimination of additional reference voltages for the reversed reference voltage amplifier arrays 240 and 250. In one embodiment of the invention, whole reversed reference voltage dummy amplifiers are coupled to different reference voltage to reduce parasitic capacitance in each reference voltage node. In addition, the reversed reference voltage dummy amplifiers will affect an output impedance of the amplifier 101 (n=0) when the signal $V_{in}$ is equal to the reference voltage $V_{ref-1}$. Thus, the current $I_0$ can be recalculated as the following formula (2)

$$I_0 = \sum_{n=-i+1}^{-k} I_{sat} h(n) + \sum_{n=-1}^{-i} I_{dn}(V_{in}) h(n) + I_{d0} h(0) + \sum_{n=1}^{k} I_{dn}(V_{in}) h(n) \quad (2)$$

where i is a number of the reversed reference voltage dummy amplifiers in the arrays 240 and 250. In formula (2), an optimal number of the reversed reference voltage dummy amplifiers can be decided by setting $I_0$=0.

Figure 3:
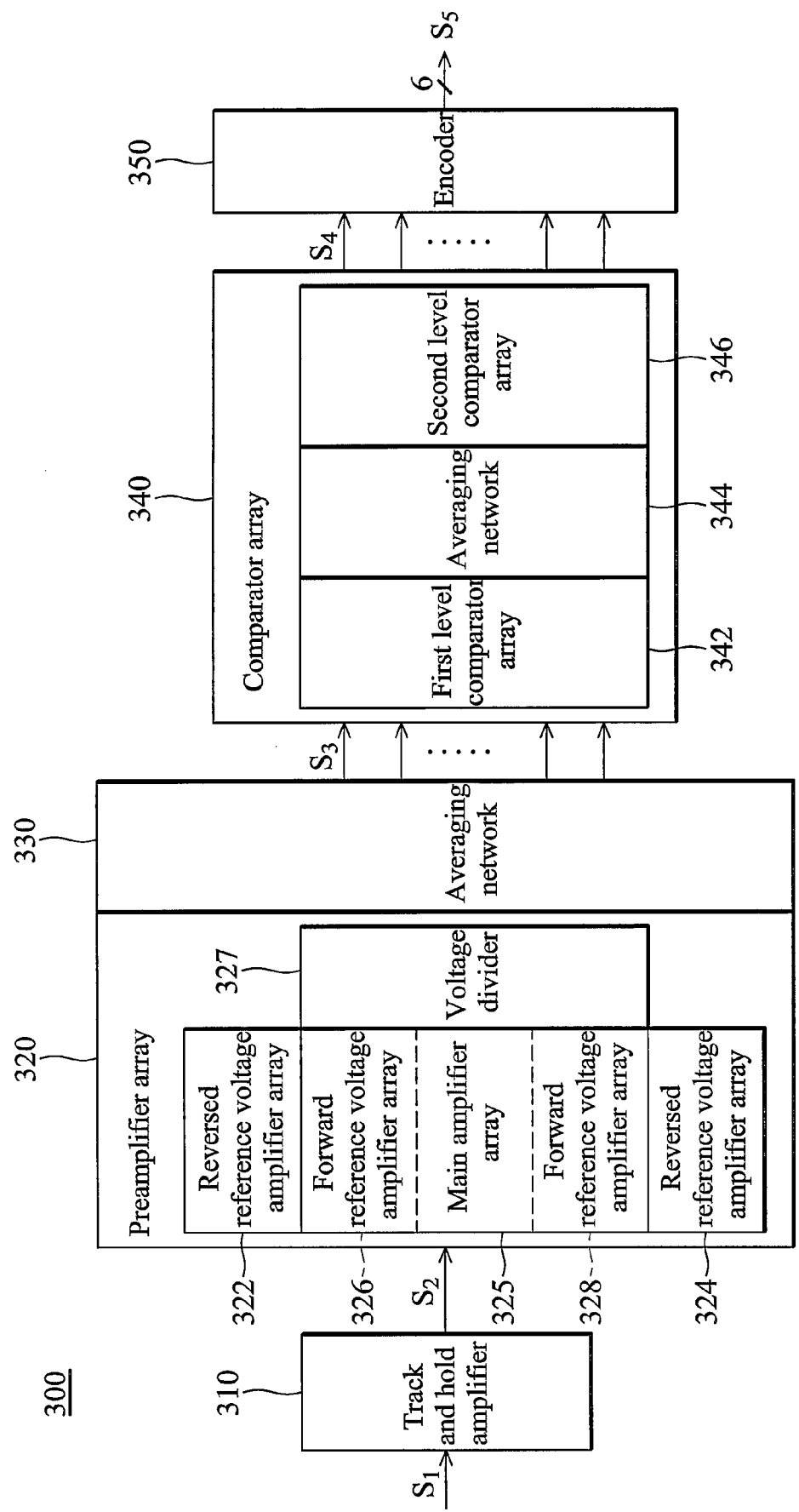
FIG. 3 shows a flash ADC according to an embodiment of the invention.

FIG. 3 shows a flash ADC 300 according to an embodiment of the invention. The flash ADC 300 is a 6-bit flash ADC, which comprises a track and hold amplifier (THA) 310, a preamplifier array 320, an averaging network 330, a comparator array 340 and an encoder 350. First, a signal. $S_1$ is sampled by the THA 310 to generate a signal $S_2$. The signal $S_2$ is amplified to generate a plurality of signal $S_3$ through the preamplifier array 320, wherein the signals $S_1$, $S_2$ and $S_3$ are analog signals. Then, the comparator array 340 receives and compares the signals $S_3$ to generate a plurality of corresponding signals $S_4$ which are digital signals. Finally, the encoder 350 receives the signals $S_4$ and performs encoding as a 6-bit signal $S_5$.

In FIG. 3, the THA 310 can alleviate bandwidth requirement of the preamplifier array 320 and mitigate signal and clock skew. The preamplifier array 320 comprises a main amplifier array 325, a voltage divider 327 and two reversed reference voltage amplifier arrays 322 and 324. The comparator array 340 comprises a first level comparator array 342 with an averaging network 344 and a second level comparator arrays 346.

Figure 4:
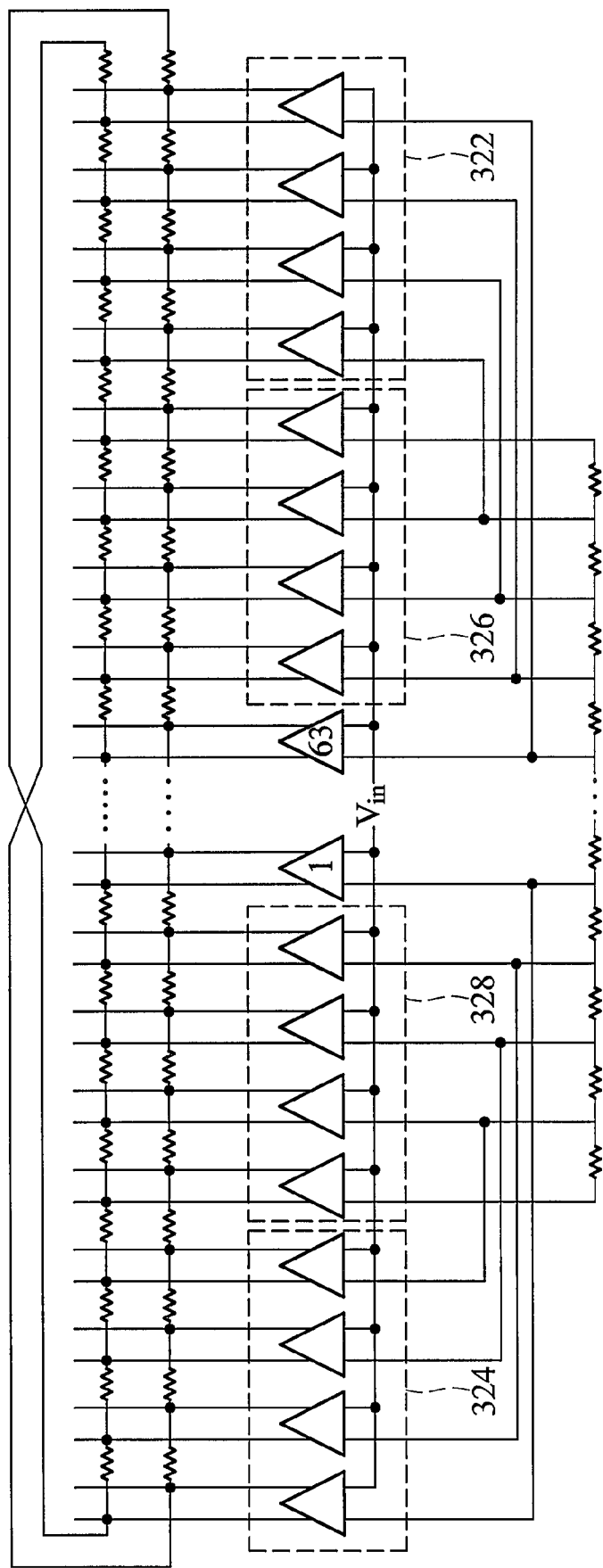
FIG. 4 shows a schematic diagram of the reversed and forward reference voltage amplifier arrays shown in FIG. 3.

For example, each reversed reference voltage amplifier arrays 322 and 324 located on both sides of the main amplifier array 325 comprise four reversed reference voltage dummy amplifiers to correct systematic error. Furthermore, the main amplifier array 325 comprises two forward reference voltage amplifier arrays 326 and 328 in order to implement the averaging network 344 in the first level comparator array 342. The forward reference voltage amplifier arrays 326 and 328 are separately located on both sides of the main amplifier array 325 and closed to the reversed reference voltage amplifier arrays 322 and 324 respectively. FIG. 4 shows a schematic diagram of the reversed reference voltage amplifier arrays 322 and 324 and the forward reference voltage amplifier arrays 326 and 328 shown in FIG. 3. Each forward reference voltage amplifier arrays 326 and 328 comprise four forward reference voltage dummy amplifiers which can provide a ZX signal to dummy comparators of the first level comparator array 342.

In FIG. 4, the amount of the forward and reversed reference voltage dummy amplifiers is an example and is not to limit the scope of the invention. The amounts of the forward reference voltage dummy amplifiers and the reversed reference voltage dummy amplifiers are separately determined according to flash ADC characteristic. Furthermore, in comparator array 340, the level number of the comparator array and whether the averaging network is required are determined according to the flash ADC characteristic. Moreover, amplifier circuit structure of the forward and reversed reference voltage amplifier array and the main amplifier array may be the same or different according to design consideration.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An amplifier array circuit, comprising:
   an amplifier array, comprising:
   a main amplifier array comprising a plurality of first amplifiers and a plurality of reference voltages, wherein the first amplifier is coupled to an input signal and the reference voltage corresponding to the first amplifier;
   a first reversed reference voltage amplifier array located on one side of the main amplifier array, having a plurality of second amplifiers coupled to the input signal and the reference voltages, respectively; and
   a second reversed reference voltage amplifier array located on the other side of the main amplifier array, having a plurality of third amplifiers coupled to the input signal and the reference voltages, respectively; and
   an averaging network coupled to a first output terminal and a second output terminal of the first, second and third amplifiers.

2. The amplifier array circuit as claimed in claim 1, wherein the third, first and second amplifiers are sequentially located in the amplifier array.

3. The amplifier array circuit as claimed in claim 1, wherein the averaging network comprises:
   a plurality of first resistors, wherein the first resistor is coupled between the first output terminal of the two adjacent amplifiers in the amplifier array; and
   a plurality of second resistors, wherein the second resistor is coupled between the second output terminals of the two adjacent amplifiers in the amplifier array.

4. The amplifier array circuit as claimed in claim 3, wherein the first output terminal of one of the second amplifiers is coupled to the second output terminal of one of the third amplifiers through the second resistor, and the second output terminal of the coupled second amplifier is coupled to the first output terminal of the coupled third amplifier through the first resistor.

5. The amplifier array circuit as claimed in claim 1, wherein the main amplifier array further comprises a first forward reference voltage amplifier array and a second forward reference voltage amplifier array, wherein the first and second forward reference voltage amplifier arrays are adjacent to the first and second reversed reference voltage amplifier arrays, respectively.

6. The amplifier array circuit as claimed in claim 5, wherein the first and second forward reference voltage amplifier arrays comprise the first amplifier.

7. The amplifier array circuit as claimed in claim 1, wherein the main amplifier array further comprises a voltage divider for generating the reference voltage.

8. The amplifier array circuit as claimed in claim 7, wherein the voltage divider comprises a plurality of third resistors connected in series.

9. A flash analog to digital converter, comprising:
   a track and hold amplifier for sampling a first analog signal to generate a second analog signal;
   a preamplifier array coupled between the track and hold amplifier and a first averaging network, amplifying the second analog signal to generate a plurality of third analog signals, comprising,
      a main amplifier array comprising a plurality of first amplifiers and a plurality of reference voltages, wherein the first amplifier is coupled to an input signal and the reference voltage corresponding to the first amplifiers;
      a first reversed reference voltage amplifier array located on one side of the main amplifier array, having a plurality of second amplifiers coupled to the input signal and the reference voltages respectively; and
      a second reversed reference voltage amplifier array located on the other side of the main amplifier array, having a plurality of third amplifiers coupled to the input signal and the reference voltages respectively, wherein the first averaging network is coupled to a first output terminal and a second output terminal of the first, second and third amplifiers;
   a comparator array having a plurality of comparators, comparing the third analog signal to generate a plurality of first digital signals; and
   an encoder for receiving the first digital signals and encoding as a second digital signal.

10. The flash analog to digital converter as claimed in claim 9, wherein the comparator array further comprises a second averaging network coupled to an output terminal of the comparator.

11. The flash analog to digital converter as claimed in claim 9, wherein the comparator array further comprises a first level comparator array, a second level comparator array and a third averaging network, wherein the third averaging network is coupled between the first and second level comparator arrays.

12. The flash analog to digital converter as claimed in claim 9, wherein the third, first and second amplifiers are sequentially located in the amplifier array.

13. The flash analog to digital converter as claimed in claim 9, wherein the first averaging network comprises:
   a plurality of first resistors, wherein the first resistor is coupled between the first output terminal of the two adjacent amplifiers in the preamplifier array; and
   a plurality of second resistors, wherein the second resistor is coupled between the second output terminals of the two adjacent amplifiers in the preamplifier array.

14. The flash analog to digital converter as claimed in claim 13, wherein the first output terminal of one of the second amplifiers is coupled to the second output terminal of one of the third amplifiers through the second resistor, and the second output terminal of the coupled second amplifier is coupled to the first output terminal of the coupled third amplifier through the first resistor.

15. The flash analog to digital converter as claimed in claim 9, wherein the main amplifier array further comprises a first forward reference voltage amplifier array and a second forward reference voltage amplifier array, wherein the first and second forward reference voltage amplifier arrays are adjacent to the first and second reversed reference voltage amplifier arrays, respectively.

16. The flash analog to digital converter as claimed in claim 15, wherein the first and second forward reference voltage amplifier arrays comprise the first amplifier.

17. The flash analog to digital converter as claimed in claim 9, wherein the main amplifier array farther comprises a voltage divider for generating the reference voltage.

18. The flash analog to digital converter as claimed in claim 17, wherein the voltage divider comprises a plurality of third resistors connected in series.

* * * * *